US011075207B2

(12) United States Patent
Sharma et al.

(10) Patent No.: US 11,075,207 B2
(45) Date of Patent: Jul. 27, 2021

(54) SRAM USING 2T-2S

(71) Applicant: INTEL CORPORATION, Santa Clara, CA (US)

(72) Inventors: Abhishek A. Sharma, Hillsboro, OR (US); Brian S. Doyle, Portland, OR (US); Ravi Pillarisetty, Portland, OR (US); Prashant Majhi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/633,061

(22) PCT Filed: Sep. 29, 2017

(86) PCT No.: PCT/US2017/054330
§ 371 (c)(1),
(2) Date: Jan. 22, 2020

(87) PCT Pub. No.: WO2019/066906
PCT Pub. Date: Apr. 4, 2019

(65) Prior Publication Data
US 2020/0235105 A1  Jul. 23, 2020

(51) Int. Cl.
G11C 11/00 (2006.01)
H01L 27/11 (2006.01)
G11C 5/06 (2006.01)
G11C 5/10 (2006.01)
G11C 11/419 (2006.01)

(52) U.S. Cl.
CPC .......... H01L 27/1104 (2013.01); G11C 5/063 (2013.01); G11C 5/10 (2013.01); G11C 11/419 (2013.01); H01L 27/1116 (2013.01)

(58) Field of Classification Search
CPC .. H01L 27/1104; H01L 27/1116; G11C 5/063; G11C 5/10; G11C 11/419
See application file for complete search history.

(56) References Cited

U.S. PATENT DOCUMENTS 5,635,731 A * 6/1997 Ashida ................... H01L 27/11
257/67
7,145,194 B2 * 12/2006 Nishida ............... G11C 11/4125
257/296

(Continued)

FOREIGN PATENT DOCUMENTS

WO  2019066906 A1  4/2019

OTHER PUBLICATIONS

International Preliminary Report on Patentability received for PCT Application No. PCT/US2017/054330, dated Apr. 9, 2020. 11 pages.

(Continued)

*Primary Examiner* — Pho M Luu
(74) *Attorney, Agent, or Firm* — Schwabe, Williamson & Wyatt, P.C.

(57) ABSTRACT

A 2T-2S SRAM cell exhibiting a complementary scheme, that includes two selector devices that exhibit negative differential resistance. Advantages include lower area and better performance than traditional SRAM cells, according to some embodiments. The term 1T-1S refers to a transistor in series with a selector device. Accordingly, the term 2T-2S refers to two such 1T-1S structures.

20 Claims, 14 Drawing Sheets

(56) References Cited

U.S. PATENT DOCUMENTS

| | | |
|---|---|---|
| 9,728,248 B2 * | 8/2017 | Tailliet ............... G11C 16/0416 |
| 2009/0059657 A1 | 3/2009 | Cannon et al. |
| 2011/0280073 A1 | 11/2011 | Chiu et al. |
| 2015/0179653 A1 * | 6/2015 | Wang .................. H01L 27/1104 257/369 |
| 2015/0340090 A1 | 11/2015 | Ma |
| 2016/0064069 A1 | 3/2016 | Menezes et al. |
| 2016/0293268 A1 | 10/2016 | Jan et al. |

OTHER PUBLICATIONS

International Search Report and Written Opinion received for PCT Application No. PCT/US2017/054330, dated Jun. 25, 2018. 14 pages.

* cited by examiner

SRAM USING 2T-2S

CROSS REFERENCE TO RELATED APPLICATIONS

This application is a U.S. national stage entry under 35 U.S.C. § 371(c) of International Application No. PCT/US17/54330, filed Sep. 29, 2017, the disclosure of which is incorporated by reference herein in its entirety.

BACKGROUND

SRAM is a type of semiconductor memory that uses bistable latching circuitry (flip-flop) to store each bit. SRAM exhibits data remanence, but it is still volatile in the conventional sense that data is eventually lost when the memory is not powered. The term static differentiates SRAM from DRAM ("Dynamic Random-Access Memory"), which must be periodically refreshed. SRAM is faster and more expensive than DRAM; it is typically used for CPU cache while DRAM is used for a computer's main memory. Conventional SRAM devices may consume significant area on the front-end of a process limiting the potential for significant storage density.

DETAILED DESCRIPTION

The present disclosure describes an SRAM cell utilizing a cross-coupling scheme but utilizes a selector device or threshold switch device (described below) in lieu of an NMOS transistor in each cross-coupled pair. For purposes of this discussion, the term 1T-1S refers to a transistor in series with a threshold switching device. Accordingly, the term 2T-2S refers to two such 1T-1S structures. To help better understand the memory cells provided herein, a conventional SRAM cell will now briefly be described with reference to FIG. 1.

Figure 1:
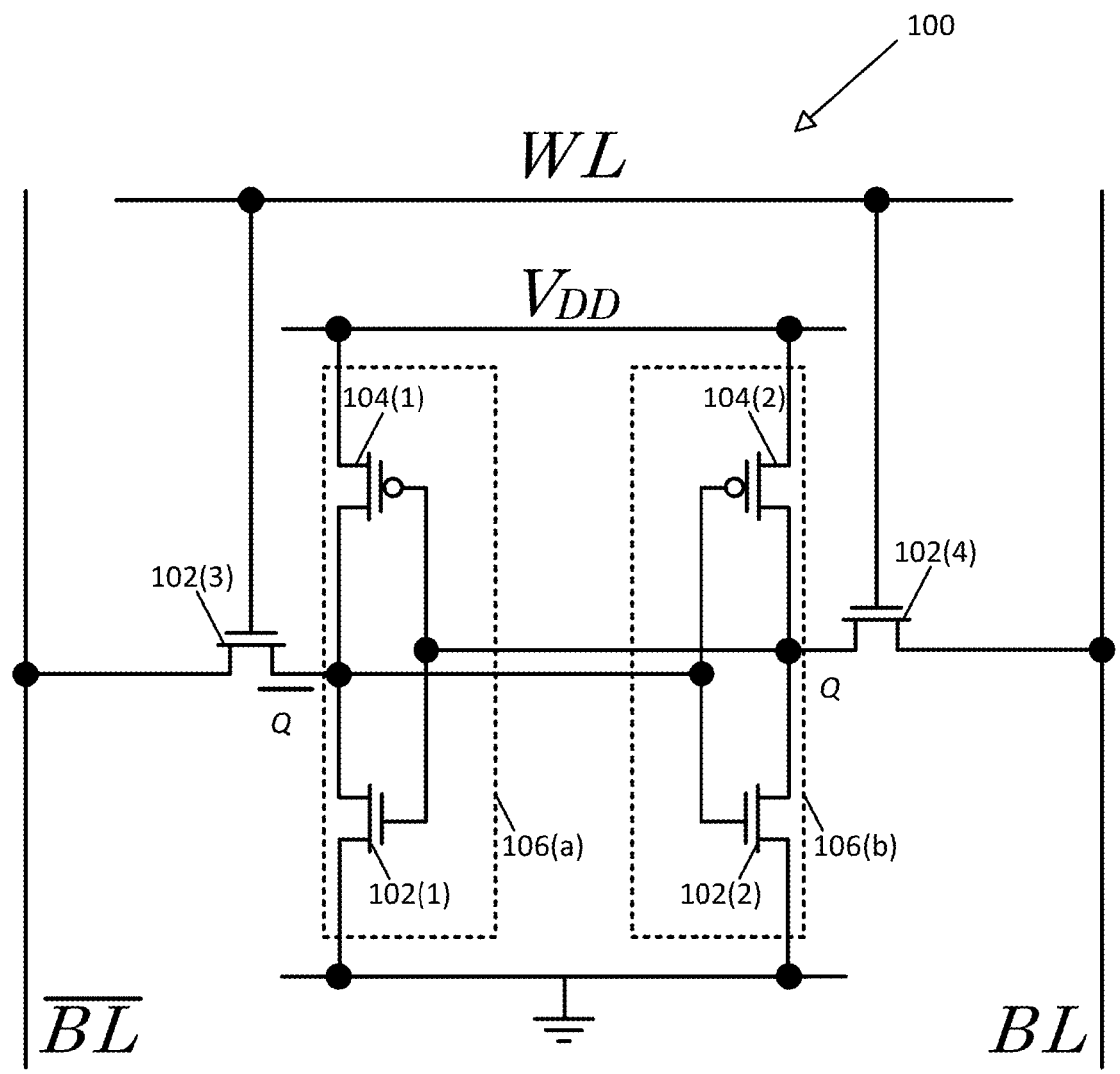
FIG. 1 is a schematic of a standard SRAM cell.

FIG. 1 is a schematic of a standard SRAM cell. SRAM cell 100 comprises cross-coupled inverters 106(a)-106(b) and access transistor 102(3)-102(4). NMOS ("N-channel Metal-Oxide-Semiconductor") transistors 102(1)-102(2) and PMOS ("P-channel Metal-Oxide-Semiconductor") transistors 104(1)-104(2) are arranged as cross coupled inverters (i.e., 106(a)-106(b)). Access transistors 102(3)-102(4) provide functionality for reading and writing SRAM cell 100. SRAM cell 100 is a 4T device meaning it utilizes four transistors, 102(1)-102(2) and 104(1)-104(2) excluding the access transistors 102(3)-102(4). Furthermore, these transistors are in the front-end of the associated process, namely the silicon layer. Correspondingly, all of the interconnect for a 4T SRAM device (e.g., 100) is also required to be in the front-end of the process. This requires a significant amount of area in the front-end. SRAM cell 100 may operate in three different states: standby (the circuit is idle), reading (the data has been requested), or writing (updating the contents). These operational states are described below.

Standby State

If word line ("WL") is not asserted, access transistors 102(3) and 102(4) disconnect SRAM cell 100 from bit lines (BL and $\overline{BL}$). Cross-coupled inverters 106(a)-106(b) will continue to reinforce each other as long as they are connected to supply VDD.

Reading State

Reading only requires asserting WL and reading SRAM cell 100 state by a single access transistor and bit line, (e.g. 102(4), BL). Nevertheless, bit lines are relatively long and have large parasitic capacitance. To speed up reading, a more complex process is used in practice. A read cycle may be started by pre-charging both bit lines BL and $\overline{BL}$, i.e., driving the bit lines to a threshold voltage (midrange voltage between logical 1 and 0) by an external module (not shown in FIG. 1). Then asserting word line WL enables both access transistors 102(3) and 102(4), which causes the bit line BL voltage to either slightly drop (bottom NMOS transistor 102(2) is ON and top PMOS transistor 104(2) is off or rise (top PMOS transistor 102(4) is on). It should be noted that if BL voltage rises, $\overline{BL}$ voltage drops, and vice versa. Then BL and $\overline{BL}$ lines will have a small voltage difference between them. A sense amplifier may sense which line has the higher voltage and thus determine whether there was 1 or 0 stored. The higher the sensitivity of the sense amplifier, the faster the read operation.

Writing State

The write cycle begins by applying the value to be written to the bit lines. To write a 0, a 0 may be applied the bit lines, i.e. setting BL to 1 and $\overline{BL}$ to 0. This is similar to applying a reset pulse to an SR-latch, which causes the flip flop to change state. A 1 may be written by inverting the values of the bit lines. WL is then asserted and the value that is to be stored is latched in. This works because the bit line input-drivers are designed to be much stronger than the relatively weak transistors in the cell itself so they can easily override the previous state of the cross-coupled inverters. In practice, access NMOS transistors 102(3) and 102(4) have to be stronger than either bottom NMOS (102(1), 102(2)) or top PMOS (104(1), 104(2)) transistors. This is easily obtained as PMOS transistors are much weaker than NMOS when same sized. Consequently, when one transistor pair (e.g. 102(2) and 104(2)) is only slightly overridden by the write process, the gate voltage on the opposite transistors pair (102(1) and 104(1)) is also changed. Thus, the 102(1) and 104(1) transistors can be easier overridden, and so on. Thus, cross-coupled inverters magnify the writing process.

Figure 2:
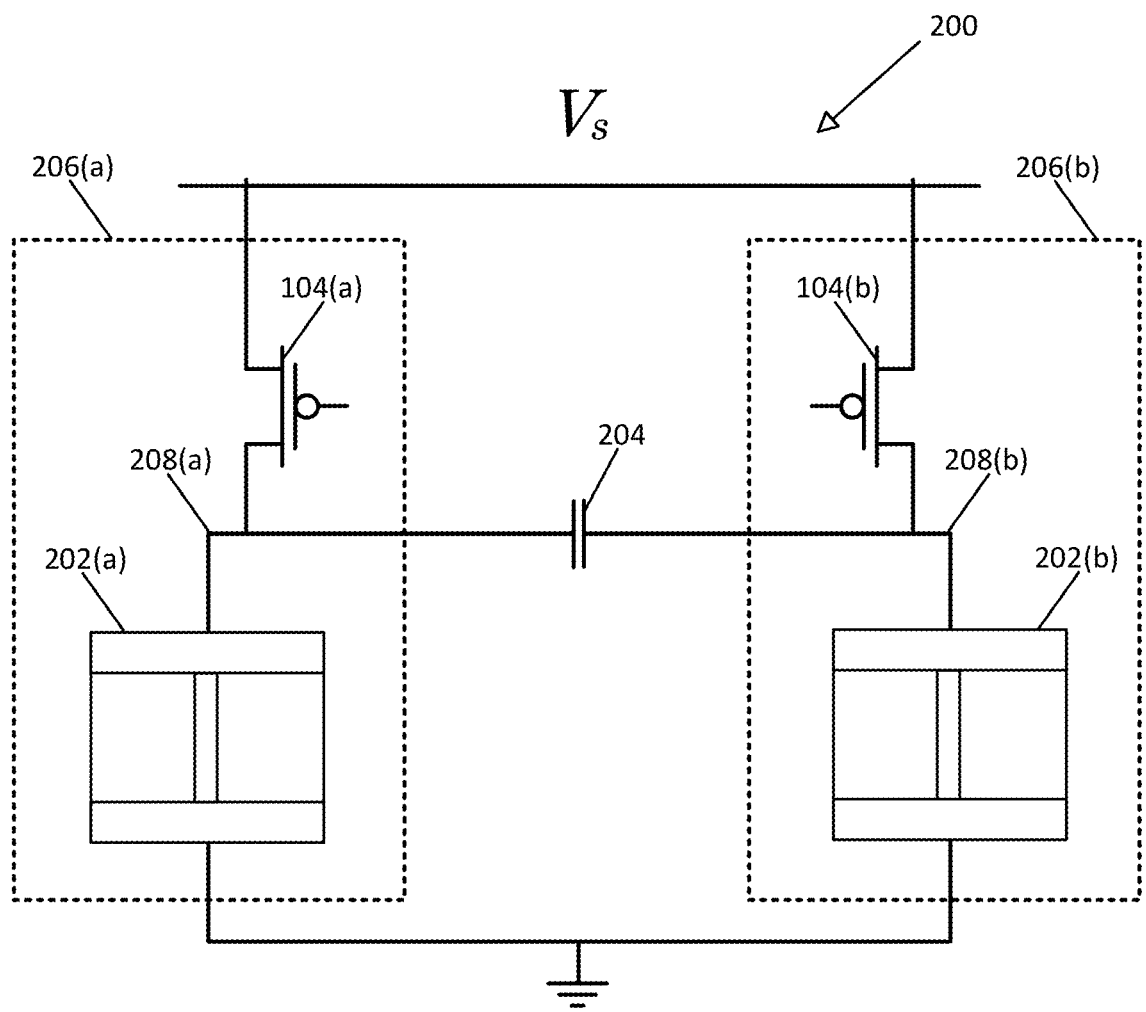
FIG. 2 is a schematic of a 2T-2S SRAM cell according to one embodiment of the present disclosure.

FIG. 2 is a schematic of a 2T-2S SRAM cell according to one embodiment of the present disclosure. As shown in FIG. 2, 2T-2S SRAM cell 200 may comprise two 1T-1S cells (206(a)-206(b)). Each 1T-1S cell (i.e., 206(a)-206(b)) may further comprise a respective PMOS transistor (104(a), 104(b)) and respective selector device (202(a)-202(b)). Each 1T-1S structure 206(a)-206(b) may behave analogously to a cross-coupled inverter (stacked PMOS and NMOS transistor, 106(a)-106(b)). An example structure of a selector device (i.e., 202(a)-202(b)) is described below with respect to FIG. 3. According to one embodiment of the present disclosure, 2T-2S SRAM cell 200 may store data via node voltages 208(a)-208(b) in a fashion analogous to the way a conventional SRAM cell 100 stores data in a cross-coupled fashion. In the context of this discussion, cross-coupled means automatic complementing on both sides of the cell.

According to one embodiment of the present disclosure, digital data may be stored based upon node voltages 208(a)-208(b) (i.e., the voltage across selectors 202(a)-202(b)). In particular, if node voltage 208(a) is low (on-state), then node voltage 208(b) will be pulled high (off-state) and vice versa via capacitor 204. Thus, low node voltage 208(a) and high node voltage 208(b) comprises a first state (e.g., an off state or digital 0) while high node voltage 208(a) and low node voltage 208(b) comprises a second state (e.g., an on state or digital 1). A process for reading and writing 2T-2S SRAM cell is described below with respect to FIG. 7.

As shown in FIG. 2, the 2 1T-1S 206(a)-206(b) structures may be coupled via capacitor 204. According to one embodiment, capacitor 204 serves to lock selector devices 202(a)-202(b) in either an on-state (low-voltage, high current) or off-state (high-voltage, low current). If the voltage at node 208(a) of capacitor 204 is pulled high, the voltage at node 208(b) of capacitor will be pulled low due to the displacement current. As will become evident, if selector 202(a) enters an on-state (i.e., digital 1), selector 202(b) will enter an off-state (i.e., digital 0) and vice versa.

In addition, capacitor 204 induces complementary behavior of selector devices 202(a)-202(b). The displacement current associated with capacitor 204 causes one selector (e.g., 202(a)) to be in an on state and the other selector (e.g., 202(b)) to be in an off state or vice versa. This behavior will become evident in context of discussion of an I-V curve associated with selector devices 202(a)-202(b).

According to one embodiment, PMOS transistors 104(a)-104(b) operate as bias or ballast devices to clamp the currents entering respective nodes 208(a)-208(b).

As compared with a conventional SRAM 4T device 100 that requires four transistors, 2T-2S SRAM 200 includes only two transistors, 104(a)-104(b), in this example embodiment. The work done by the remaining two transistors of SRAM 4T 100 device is performed by selector devices 202(a)-202(b). 2T-2S SRAM 200 consumes significantly less area compared with conventional SRAM 100. In addition, because only two transistors (104(a)-104(b)) are required for 2T-2S SRAM 200, selector devices 202(a)-202(b) may be integrated into the back-end of a process and thus are not fabricated in silicon. Thus, no silicon area is consumed by selectors 202(a)-202(b), which conserves area for the entire device 200.

Because 2T-2S SRAM 200 uses fewer capacitors than conventional SRAM device 100, the total capacitance of 2T-2S SRAM device is lower and therefore typically exhibits better dynamic switching performance than conventional SRAM 100. This is due to the fact that charging and discharging of the storage nodes is faster due to the lower capacitance. There is also better static power performance because when 2T-2S SRAM 200 device is in an OFF-state (described below) there is very low static power dissipation due to leakage. According to one embodiment, static power dissipation may be as low $10^{-12}$A.

Selector (Threshold Switching Device)

Figure 3:
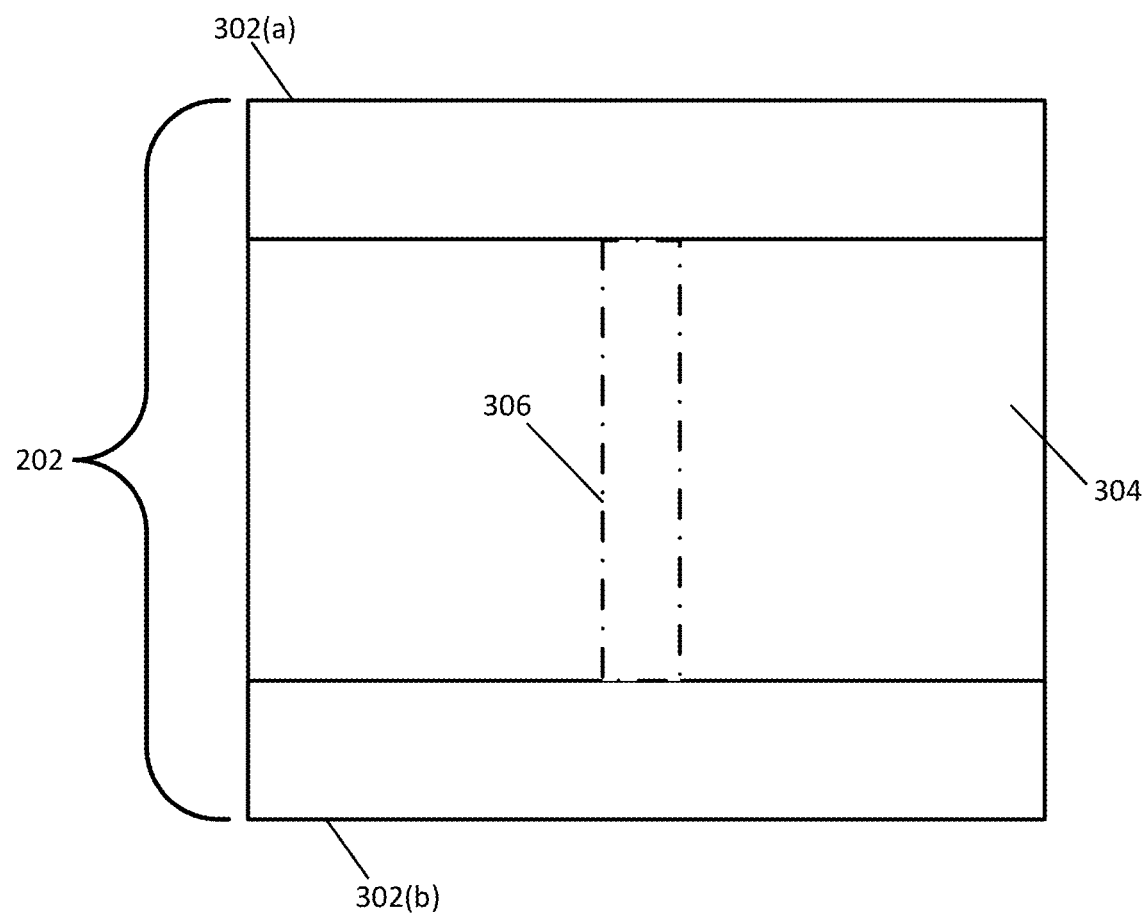
FIG. 3 depicts a structure of a selector according to one embodiment of the present disclosure.

FIG. 3 depicts a structure of a selector device according to one embodiment of the present disclosure. Selector device 202 may be any 2-terminal device that exhibits a voltage-dependent volatile resistance state change. According to one embodiment of the present disclosure, when a voltage across selector device 202 exceeds a pre-determined value herein referred to as the threshold voltage, the resistance of selector device 202 is reduced to a very low value. Characteristic I-V curves for selector device 202 is described below with respect to FIGS. 5a-5g.

Threshold Voltage, Holding Voltage and Filament

As previously noted, selector device 202 may be any 2-terminal device that shows a voltage dependent volatile resistance state change. Selector device 202 may comprise a resistive random-access memory ("RRAM" or "ReRAM"), which may be any type of non-volatile ("NV") random-access ("RAM") computer memory that operates by changing the resistance across a dielectric solid-state material often referred to as a memristor.

Certain disordered glasses (including polycrystalline films with defects) like chalcogenides and some oxides show a characteristic bistability in their resistance states. Several mechanisms have been advanced to explain this change in conductivity ranging from carrier injection, field-driven nucleation and growth of conducting laments, insulator-metal transitions, and so on. Despite the variety in the physical mechanisms, all of the theories agree that as the voltage across a device composed of such elements is increased, the current through the device undergoes a localization process that is concurrent with a drop in device resistance and is accompanied by a negative differential resistance regime in the device I-V characteristic.

In particular, according to one embodiment of the present disclosure, selector device 202 may comprise a dielectric, which is non-conductive (insulating) in a first state and conductive in a second state. A conductive state may be achieved through the formation of filament 306 or conduction path, which is generated after application of a sufficiently high voltage across selector device 202. Note that filament 306 is shown in FIG. 3 using dotted lines to indicate its transitory nature.

Filament 306 may arise from different mechanisms, including vacancy or metal defect migration. Once filament 306 is formed, it may be reset (broken, resulting in high resistance) or set (re-formed, resulting in lower resistance) by another voltage. The low-resistance path can be either localized (filamentary) or homogeneous. Both effects can occur either throughout the entire distance between the electrodes or only in proximity to one of the electrodes.

According to one embodiment of the present disclosure, when an applied voltage across selector device 202 exceeds a certain value known as a threshold voltage $V_t$, the resistance of selector device 202 is reduced to a low value, which occurs due to the formation of filament 306. This high conductivity (low resistance) state may be maintained so long as the voltage across selector device 202 is higher than a holding voltage $V_h$ (described below). On the other hand, when the voltage across selector device 202 is reduced below $V_h$, the resistance across selector 202 returns to an insulating or resistive state and filament 306 is dissolved.

Example Selector Materials

According to one embodiment selector device 202 may comprise an oxide/semiconductor 304 sandwiched between a first 302(a) and second 302(b) metal layer. According to alternative embodiment, any other materials that exhibit a volatile resistance state change may be utilized for element 304. For example, other materials that exhibit a volatile resistance state change include niobium dioxide (NbO2), tantalum oxide (TaOx), vanadium dioxide (VO2), nickel oxide (NiO), chalgogenides such as titanium (Ti), tellurium (Te), arsenic (As), germanium (Ge), hafnium tantalum oxide (HfTaOx), hafnium niobium oxide (HfNbOx), hafnium nickel oxide (HfNiOx), niobium tantalum oxide (NbTaOx), and nickel tantalum oxide (NiTaOx). Other comparable or otherwise suitable materials will be apparent in light of this disclosure.

Multiple inorganic and organic material systems display thermal or ionic resistive switching effects. Example materials include phase-change chalcogenides such as germanium-antimony-tellurium (Ge2Sb,2Te5) or silver-indium-antimony-tellurium (AgInSbTe), binary transition metal oxides such as nickel oxide (NiO) or titanium oxide (TiO), perovskites such as strontium zirconium titanate (Sr(Zr)TiO3) or PCMO, solid-state electrolytes such as germanium sulfide (GeS), germanium selenide (GeSe), silicon oxide (SiOx) or copper sulfide (Cu2S).

According to one embodiment of the present disclosure, metal layers 302(a)-302(b) may exhibit a thickness of between 2 and 50 nm. Oxide semiconductor layer 304 may exhibit a thickness of between 5-80 nm. In particular, for low voltage applications less than 1.5 volts, oxide semiconductor layer 304 thickness may be between 5-20 nm and for high voltage applications (1.5-3.3 volts), oxide semiconductor 304 thickness may be between 20-80 nm.

Figure 4:
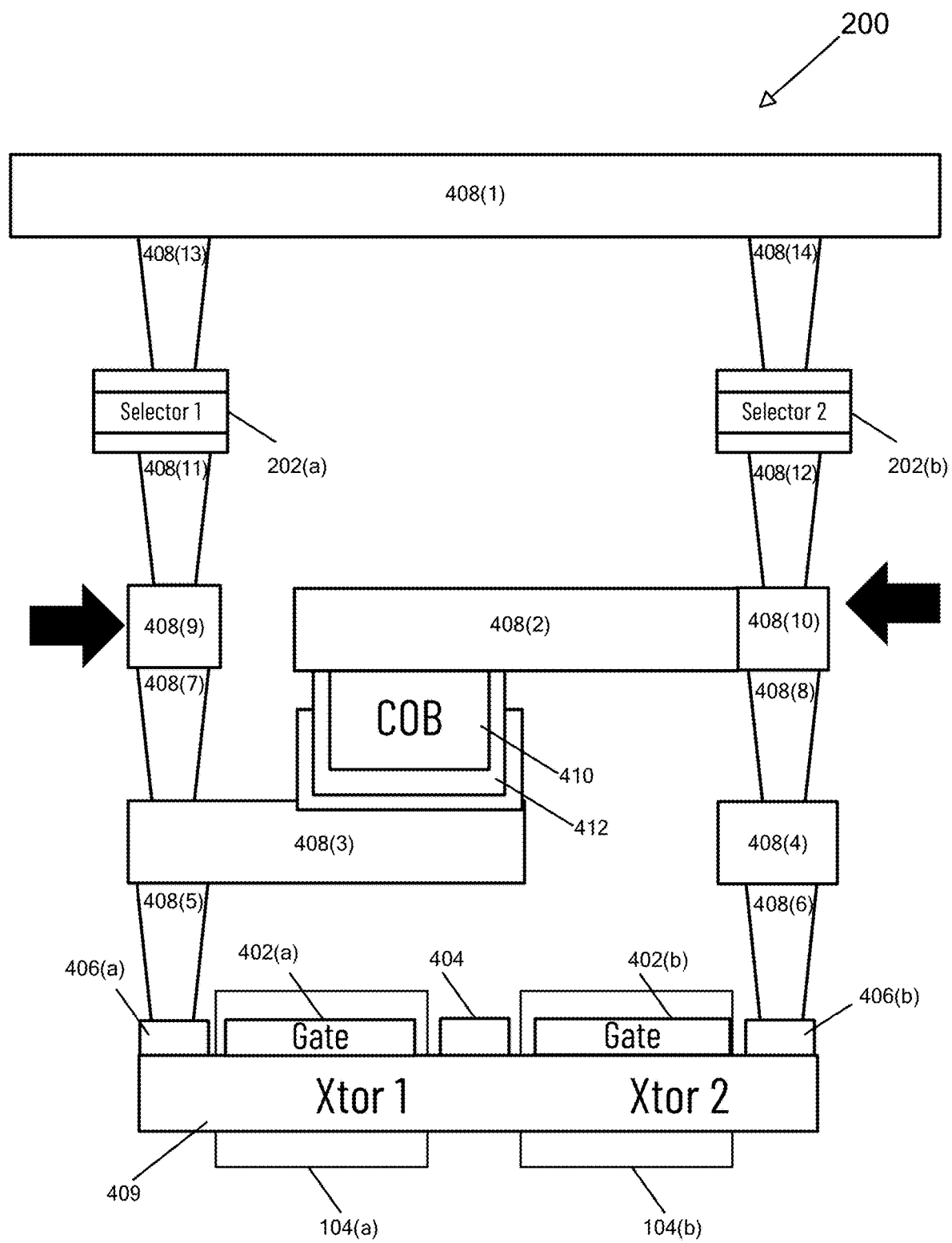
FIG. 4 shows an example physical layout of a 2T-2S SRAM cell in a cross-sectional view according to one embodiment of the present disclosure.

FIG. 4 shows an example physical layout of a 2T-2S SRAM cell in a cross-sectional view according to one embodiment of the disclosure. As shown in FIG. 4, 2T-2S device 200 is formed in the back-end interconnect structure, which is in turn formed over a device layer 409. In this example case, the device layer (silicon) 409 includes transistors 104(a)-104(b), while the back-end interconnect structure includes a number of metal layers. Note the that interlayer dielectric material or insulator fill associated with those layers is not shown, to allow for focus on the memory cell structure. As can be further seen, within those various metal layers are provided a COB ("Capacitor Over Bitline") 410, first selector 202(a), and second selector 202(b). As will be understood, COB 410 represents a capacitive element that is fabricated over metal layers. COB 410 may further comprise dielectric 412 and metal contacts or plates. According to one embodiment, metal contacts or plates may be constructed from titanium nitride (TiN), tantalum nitride (TaN), tantalum (Ta), titanium (Ti), etc. The dielectric may be a single layer or multiple layers comprising partly or wholly zirconium oxide (ZrOx), aluminum oxide (AlOx), hafnium oxide (HfOx), hafnium aluminum oxide (HfAlOx), aluminum zirconium oxide (AlZrOx), etc.

Charge may be stored across metal plates of COB 406. According to one embodiment of the present disclosure, COB 410 may operate to store charge in order to maintain one of selector devices (202(a)-202(b)) in an on state and the other simultaneously in an off state.

According to one embodiment of the present disclosure, transistors 104(a)-104(b) may be front-end silicon (Si), silicon germanium (SiGe), or germanium (Ge) transistors fabricated in the device layer. In other embodiments, transistors 104(a)-104(b) may be back-end transistors fabricated in the interconnect structure or other back-end layer and utilize a channel comprised of zinc oxide (ZnO), indium oxide (InOx), indium tin oxide (ITO), alumina zinc oxide (AZO), indium zinc oxide (IZO), indium gallium zinc oxide (IGZO), gallium zinc oxide (GZO), tin oxide (SnO), cobalt oxide (CoO), cupric oxide (CuO), cuprous oxide (Cu2O), or titanium oxide (TiOx), to name a few example back-end channel materials. Transistors 104(a)-104(b) may further comprise device layer (silicon) 409, respective gate terminals 402(a)-402(b) and source terminals 406(a)-406(b). Source terminals 406(a)-406(b) may be coupled to respective terminals of COB 410. Transistors 104(a)-104(b) share common drain terminal 404. In particular, drain terminal 404 may be connected to the power supply. 408(1)-408(14) are conductive feature of the interconnect structure (e.g., vias, metal lines, ground nodes, etc). In one example scenario, conductive feature 408(1) is a ground node, or a node at some other desired potential, depending on the given application.

As shown in FIG. 4, four metal layers (sometimes referred to as interconnect layers or ILD layers) are used in this example embodiment. Other embodiments may use a different number of back-end metal layers, as will be appreciated, such as two metal layers, or five metal layers, etc. In a more general sense, the back-end memory cell features can span two or more metal layers, depending on the integrated circuit device layout and complexity. Four metal layers are used in this example embodiment, as lateral area is fitted to vertical area. That is, according to one embodiment, connections are performed vertically. Lateral area tends to be more expensive than vertical area. Replacing a 3-terminal device (NMOS) with 2-terminal device selector, reduces the area because fewer contacts are needed. Using a selector device 202, which may be fabricated in the back-end rather than the front-end where the device layer is formed, reduces area in the front-end and therefore consumes less area in silicon (or other device layer semiconductor).

Figure 5A:
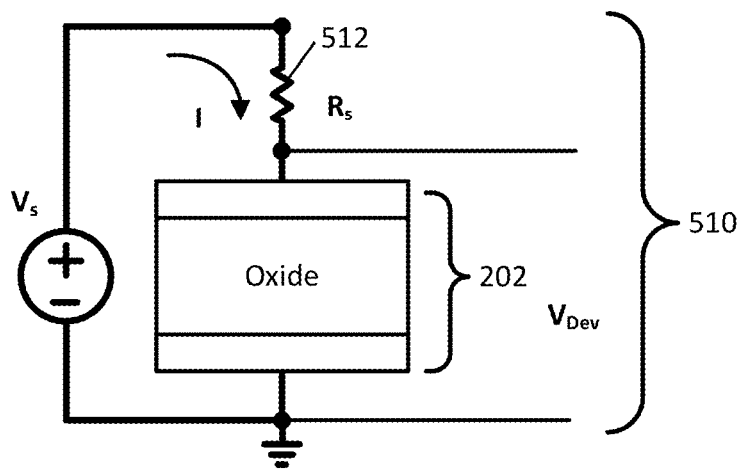
FIG. 5a shows a circuit schematic of a selector device in series with a resistor, according to one embodiment of the present disclosure.

FIG. 5a shows a circuit schematic of a selector device in series with a resistor, according to an embodiment of the present disclosure. A voltage source $V_s$ may be applied across resistor-selector pair 510 comprising resistor 512 and selector device 202. As will be described below, resistor-selector pair 510 may exhibit oscillatory or non-oscillatory behavior depending upon the bias voltage (i.e., $V_s$).

Figure 5B:
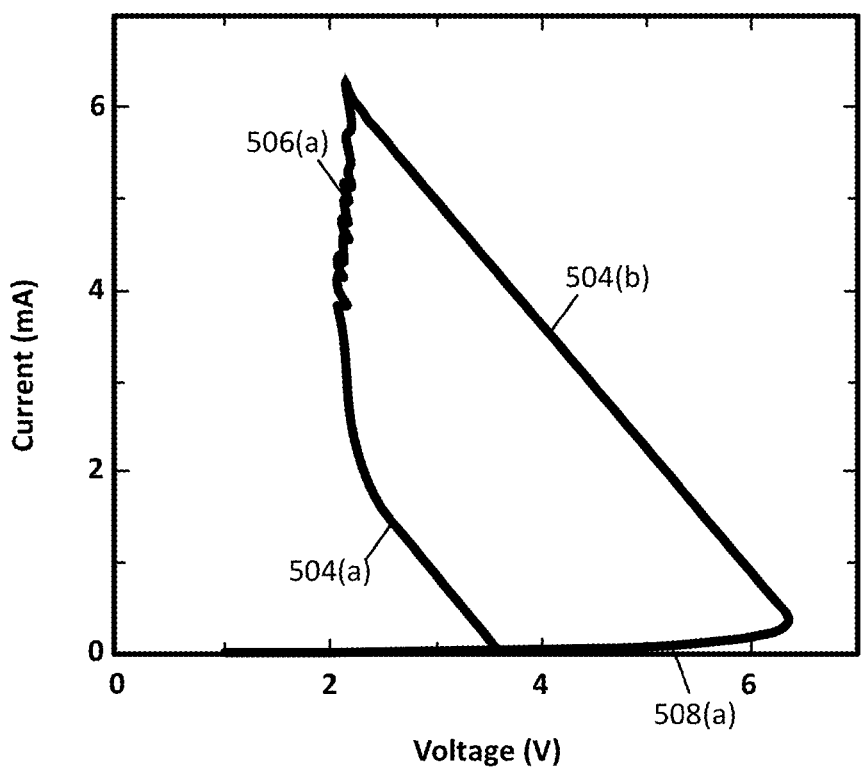
FIG. 5b shows an I-V characteristic of a selector device showing a metastable ON-state when stressed with a triangular pulse, according to one embodiment of the present disclosure.

FIG. 5b shows an I-V characteristic of a selector device showing a metastable ON-state when stressed with a triangular pulse, according to one embodiment of the present disclosure. As shown in FIG. 5b, the I-V curve shown may be characterized by four (4) regimes. OFF-state regime 508(a) is a high resistance state (i.e., $$\frac{dV}{dI}$$

is high). ON-state regime 506(a) is a low resistance state (i.e., $$\frac{dV}{dI}$$

is low). Regimes 504(a)-504(b) are negative differential resistance ("NDR") states $$\left(\text{i.e.,} \frac{dV}{dI} < 0\right).$$

In OFF-state regime 508(a), as the bias across the device-resistance pair 510 (202 and 512) is slowly increased, the current through selector device 202 increases and eventually, at a threshold voltage, selector device 202 enters negative differential resistance regime 504(b). This implies that selector device 202 forms conductive filament 306 (shown in FIG. 3) as it enters negative differential resistance (NDR) and this abrupt reduction in resistance induced by the formation of conductive filament 306 is responsible for the differential resistance becoming negative in NDR regime 504(a).

Depending on the overdrive-voltage (differential voltage beyond the threshold voltage) applied to the selector device 202, selector device 202 may settle down to various low-resistance states, or ON-state regimes 506(a) (described below). ON-state regime 506(a) may be completely volatile (corresponding to a volatile filament 306), and selector device 202 may revert to OFF-state regime 508(a) (filament dissolved), once the voltage is removed. The voltage and current associated with this reversal and dissolution of filament 306 (not shown in FIG. 5a) is designated as the holding voltage $V_h$ and holding current $I_h$. Thus, when a voltage across selector device 202 falls below $V_h$, filament 306 (not shown in FIG. 5a) is dissolved.

Figure 5C:
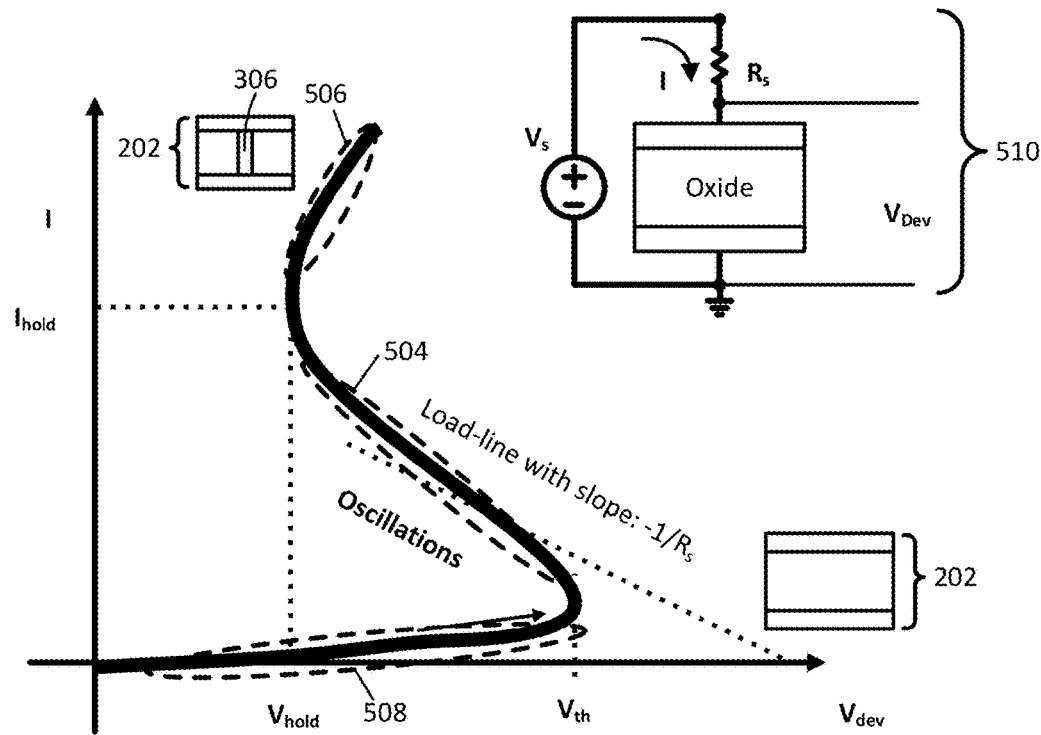
FIG. 5c shows an I-V curve of a selector device in relation to an ON-state and an OFF-state along with associated presence or non-presence of a filament, according to one embodiment of the present disclosure.

FIG. 5c shows an I-V curve of a selector device in relation to an ON-state and an OFF-state along with associated presence or non-presence of a filament according to one embodiment of the present disclosure. As shown in FIG. 5c, the I-V curve exhibits S-type negative differential resistance. The term S-type refers to the fact that the I-V curve is shaped like the letter 'S'. For purposes of this discussion, differential resistance will be understood to be the derivative of the voltage with respect to the current $$r_{diff} = \frac{dv}{di}.$$

Points on the I-V curve where the slope is negative indicate that an increase in voltage results in a decrease in current, thus defining a negative differential resistance ($r_{diff}$<0).

As shown in FIG. 5c, three respective distinct regions may be observed in the I-V curve. In particular, FIG. 5c shows three distinct regions of operation, ON-state 506 characterized by low voltage, high current and low resistance (high conductivity), OFF-state 508 characterized by high voltage, low current and high resistance (low conductivity) and negative differential ("NDR") region 504, which is unstable. NDR region 504 may be understood as exhibiting a negative resistance in that I-V curves in those regions exhibit a decreasing current as the voltage is increased.

In particular, FIG. 5c shows an I-V curve characterizing the state change across selector device 202 induced by varying voltage $V_s$ across resistor-selector pair 510. As shown in FIG. 5c, OFF-state 508, characterized by a high resistance/low conductivity state occurs when $V_{DEV}$ falls below $V_t$. Note the absence of a filament in selector device 202 while in OFF-state 508. As the voltage across selector-device 202 is increased and eventually exceeds $V_t$, selector device may enter ON-state 506 characterized by low resistance/high conductivity. This high conductivity state 506 may be caused due to formation of filament 306 in selector device 202. The transition between OFF-state 508 and ON-state 506 may occur via NDR state 504. Once selector device 202 is in ON-state 506, it may remain in such state until the voltage across selector device 202 falls below $V_h$, in which case, selector device 202 may transition to OFF-state 508 via dissolution of filament 306.

Figure 5D:
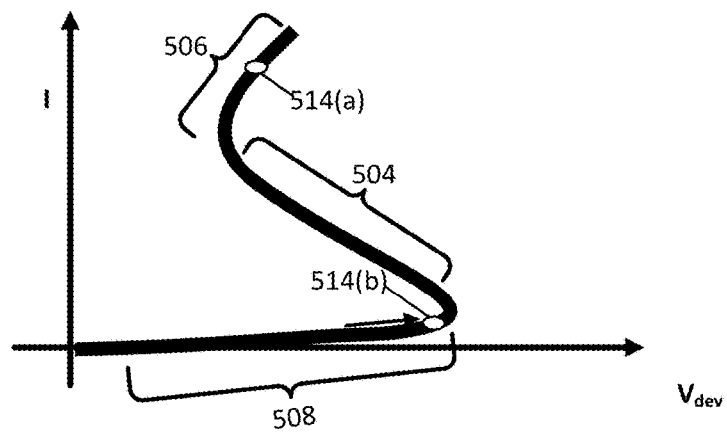
FIG. 5d shows an I-V curve of a selector device with respect to two particular operating points, according to one embodiment of the present disclosure.

FIG. 5d shows an I-V curve of a selector device 202 with respect to two particular operating points according to one embodiment of the present disclosure. As shown in FIG. 5d, selector device may operate in ON-state 506 at operating point 514(a) and transition to OFF-state 508 at operating point 514(b) via NDR regime 504. Thus, operating points 514(a)-514(b) may describe two discrete states (ON and OFF) for operation of selector device 202.

According to one embodiment, NDR region 504 resistance allows two states (ON-state 506 and OFF-state 508), each of which is activated or deactivated at different voltages. To exhibit a change in voltage without change in current, NDR region 504 is necessary. The I-V curve shown in FIG. 5d may exhibit a snap-back behavior, which is facilitated by NDR region 504. In particular, this behavior allows an SRAM cell to exhibit a change in voltage without a corresponding change in current in order to maintain two states.

Figure 5E:
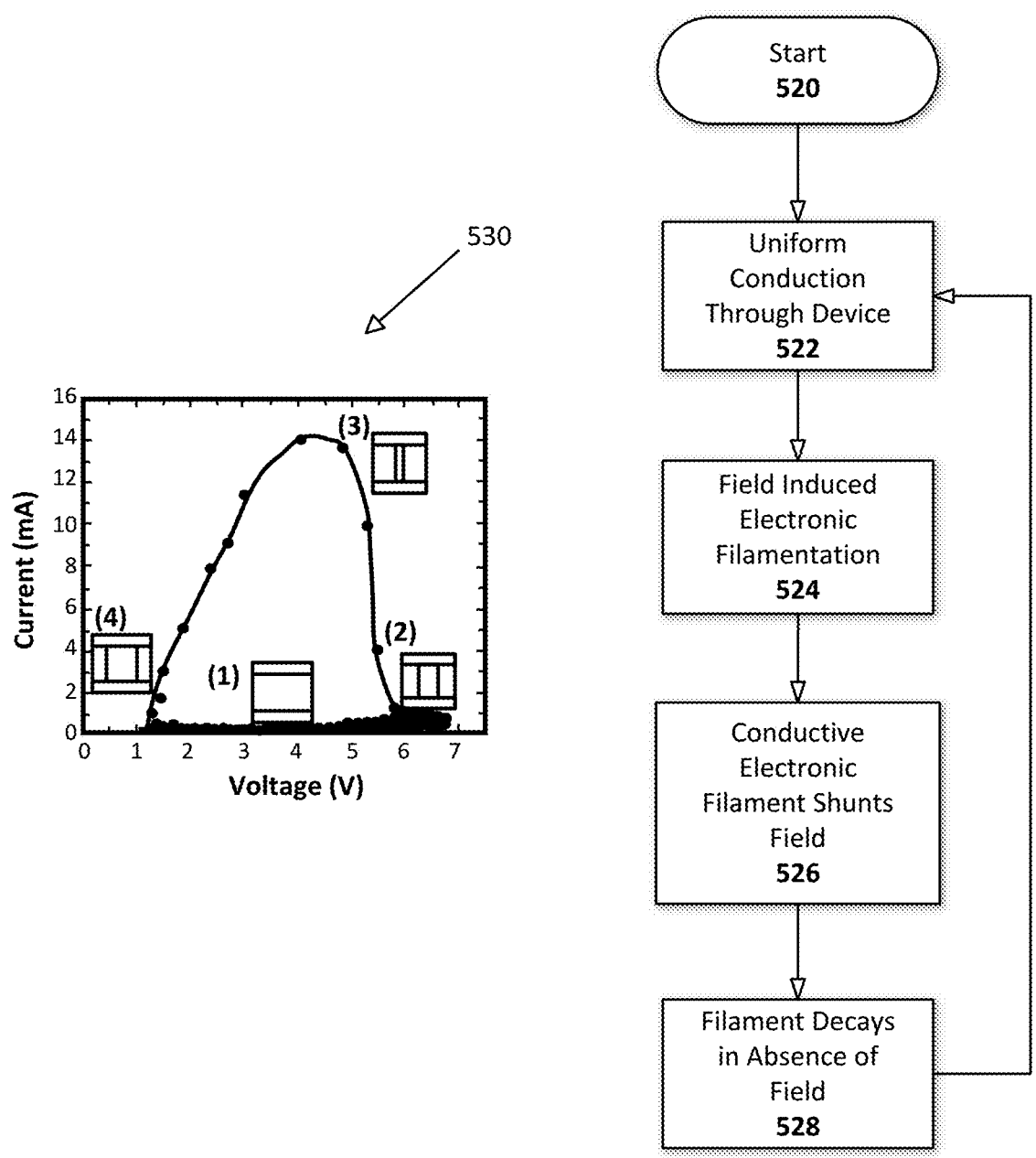
FIG. 5e is a flowchart depicting an oscillatory cycle of a selector device and an example corresponding I-V plot, according to one embodiment of the present disclosure.

FIG. 5e is a flowchart depicting an oscillatory cycle of a selector device according to one embodiment of the present disclosure. The flowchart shown in FIG. 5e corresponds to phase diagram 530 also shown in FIG. 5e. As shown in FIG. 5e, the process is initiated in 520. In 522, the selector device 202 exhibits uniform conduction. In 524, a filament 306 may be induced in the selector device 202 due to the introduction of an external field and associated voltage that exceeds $V_t$.

In 526, the induced conductive electronic filament 306 shunts the electric field, thereby reducing the voltage across the selector device 202 and the voltage across the selector device 202 begins to decline. In 528, once the voltage across the selector device 202 falls below $V_h$, the filament 306 decays thereby increasing the resistivity of the selector device 202. In this case, the voltage across the selector device 202 may begin to rise again. Flow then continues with 522 and the cycle is repeated.

Figure 5F:
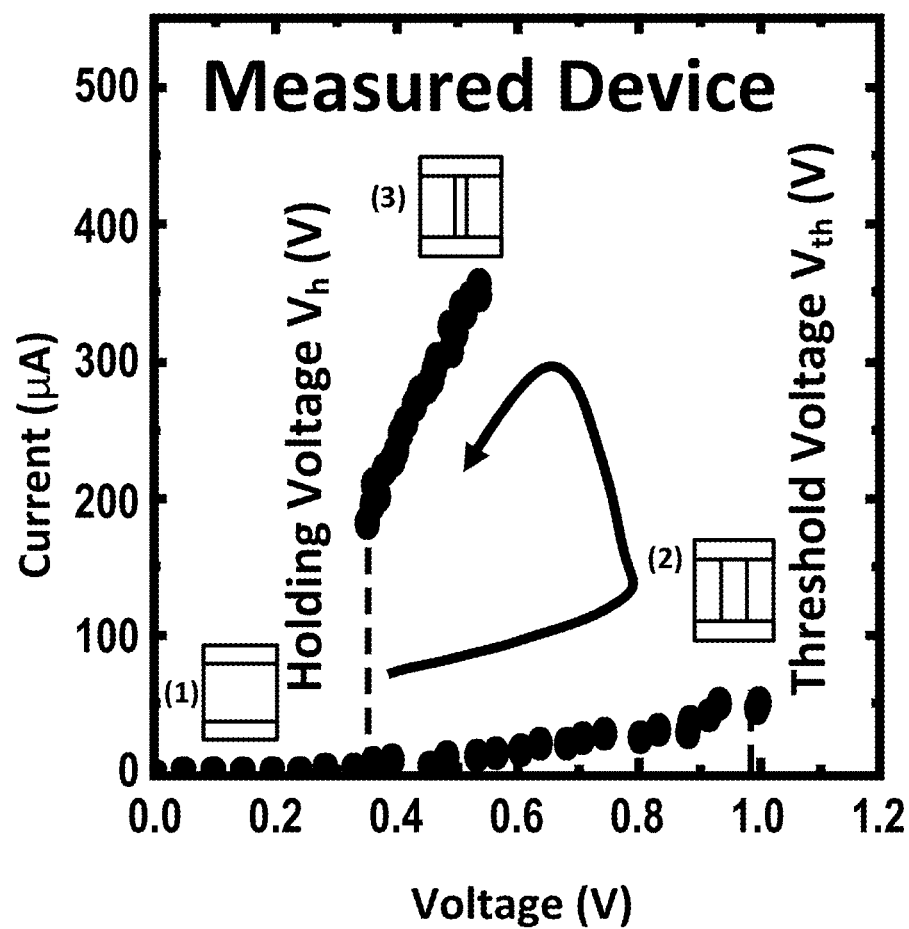
FIG. 5f shows data points of an I-V curve of a selector device in respective ON and OFF states, according to one embodiment of the present disclosure.

FIG. 5f shows data points of an I-V curve of a selector device in respective ON and OFF states according to one embodiment of the present disclosure.

Figure 5G:
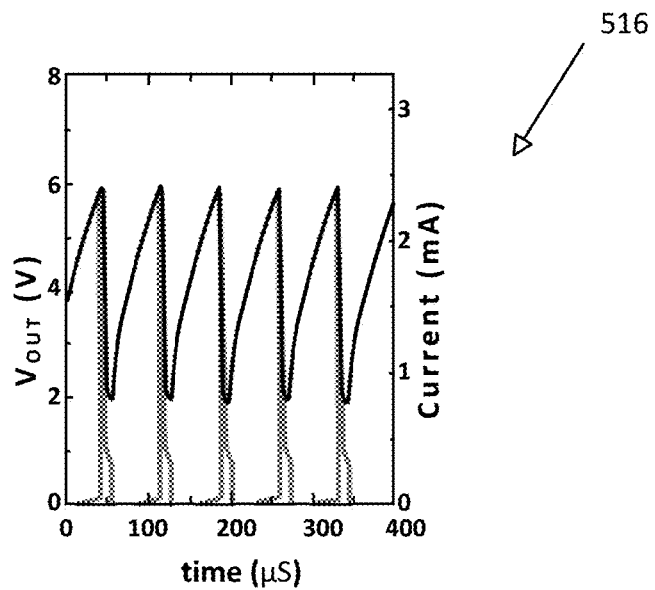
FIG. 5g illustrates time-domain voltage and current waveforms of oscillatory behavior of a selector device-resistance pair between an ON-state and an OFF-state, according to one embodiment of the present disclosure.
Figure 5G:
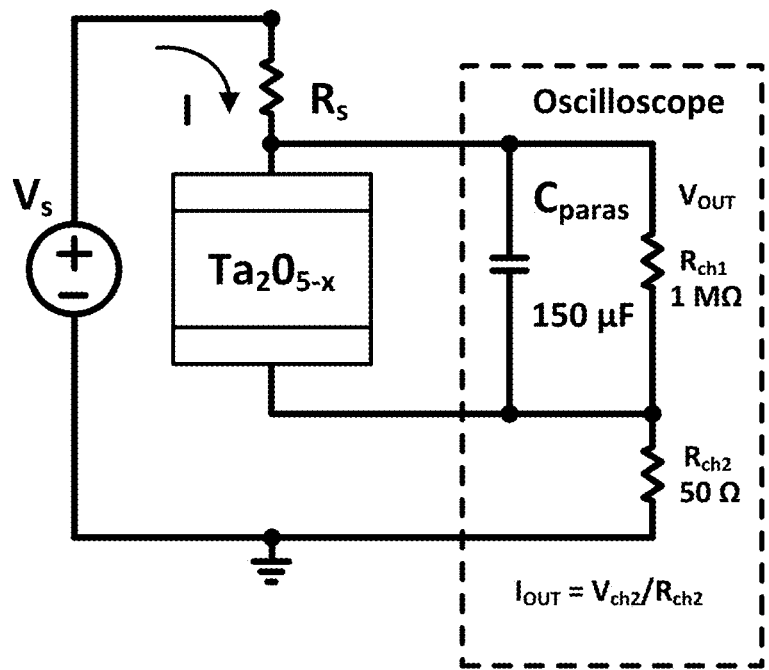

FIG. 5g illustrates time-domain voltage and current waveforms of oscillatory behavior of a selector device-resistance pair between an ON-state and an OFF-state according to one embodiment of the present disclosure. As shown in FIG. 5g once selector device 202 switches to ON-state 506(a) (temporary low-resistance state), the resistance of selector device 202 experiences a rapid decrease. Due to the voltage division enforced by the resistance in series, the voltage across selector device 202 drops. This drives selector device 202 to an I-V point in ON-state regime 506(a) that is lower than the holding voltages $V_h$ and the current $I_h$. Thus, conductive filament 306 is unstable and thus dissolves, driving selector device 202 back to OFF-state 508(a). Once in the high-resistance state, the voltage across selector device 202 starts increasing, eventually exceeding the threshold voltage, which causes selector device 202 to go back to ON-state 506(a). Thus, selector device 202 may undergo sustained oscillations between ON-state regime 506(a) and OFF-state regime 508(a).

Phase Coupled Selector Devices

Figure 6A:
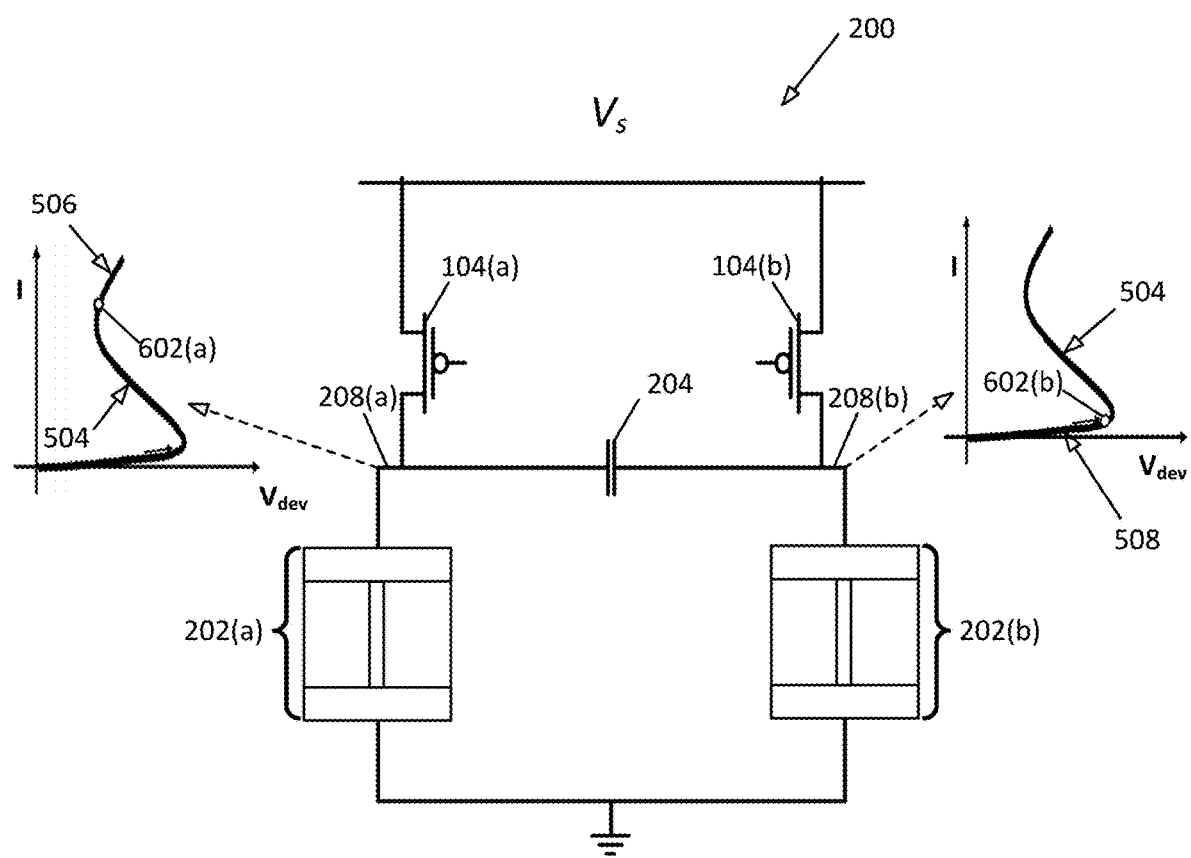
FIG. 6a shows a schematic of a 2T-2S SRAM cell and associated I-V curves and operating points for representing a binary state, according to one embodiment of the present disclosure.

FIG. 6a shows a schematic of a 2T-2S SRAM cell and associated I-V curves and operating points for representing a binary state according to one embodiment of the present disclosure. As shown in FIG. 6a and FIG. 2, according to one embodiment, capacitor 204 may couple oscillating nodes 208(a), 208(b) of selector devices 202(a), 202(b). Capacitor 204 acts as a high-pass filter such that a current flows through capacitor 204 every time a transition occurs between selector devices 202(a) and 202(b).

Note that selector device 202(a) is in ON-state 506, as reflected by operating point 602(a) on the associated I-V curve of selector device 202(a). Selector device 202(b), on the other hand, is in OFF-state 508 as reflected by operating point 602(b) on the I-V curve associated with selector device 202(b). ON-state 506 and OFF-state 508 are stable states. NDR region 504 which is an unstable state, operates as a transition region between ON-state 506 and OFF-state 508. According to one embodiment of the present disclosure, each of the respective selector devices 202(a)-202(b) may be parked in either an ON-state 506 or an OFF-state 508 such that the states of the respective selectors 202(a)-202(b) are complementary. That is, if selector 202(a) is in ON-state 506, selector 202(b) is in an OFF-state 508. Conversely, if selector 202(a) is in OFF-state 508, selector 202(b) is in an ON-state 506.

Data may be stored in 2T-2S SRAM cell 200 by virtual of the respective complementary states of selector device 202(a) and selector device 202(b). For example, the arrangement in which selector device 202(a) is in ON-state 506 and selector device 202(b) is in OFF-state 508 may correspond to a digital '1'. Conversely, the arrangement in which selector device 202(a) is in OFF-state 508 and selector device 202(b) is in ON-state 506 may correspond to a digital '0'.

According to one embodiment of the present disclosure, the bias voltage $V_s$ may determine whether selector devices 202(a) and 202(b) exhibit stable or oscillatory behavior. In particular, if $V_s > V_{osc-thresh}$, then the arrangement shown in FIG. 6a does not oscillate and therefore may function as a viable SRAM cell. On the other hand, if $V_s \leq V_{osc-thresh}$, then selector devices 202(a)-202(b) will exhibit oscillatory behavior.

Figure 6B:
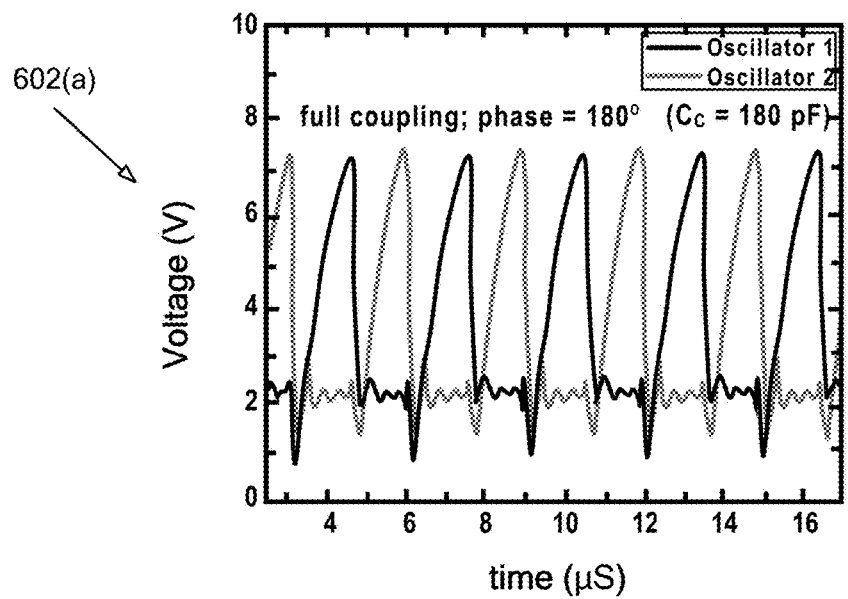
FIG. 6b shows example voltage waveforms for two selectors utilizing a variable phase coupling arrangement such as that depicted in FIG. 6a, according to one embodiment of the present disclosure.

FIG. 6b shows example voltage waveforms for two selectors utilizing a variable phase coupling arrangement such as that depicted in FIG. 6a. As shown, in FIG. 6a, voltage waveforms associated with respective selector devices 202(a)-202(b) are 180° out of phase.

As previously described, for a single selector device 202 (uncoupled), when the selector device 202 transitions to ON-state 506, the filament 306 formed is unstable (i.e., the current in ON-state 506) is lower than the holding current $I_h$). Thus, the filament 306 will dissolve and the voltage across selector device 202 will start increasing (OFF-state 508).

To understand the electrical dynamics associated with two coupled selector devices such as that shown in FIG. 6a, assume that at $t=t_0$, selector device 202(a) is in ON-state 506, while oscillator 202(b) is in the OFF-state 508. Thus, at $t_0$, a large current is owing through selector device 202(a) (thus the voltage across selector device 202(a) is low), while the voltage across selector device 202(b) is gradually rising. The rising voltage across selector device 202(b) causes the high-pass filter instrumented by capacitor 204 to shunt a substantial amount of current into selector device 202(a).

While in uncoupled oscillators, any ON-state 506 would have been unstable, but the supply of this extra current to selector device 202(a) from selector device 202(b), results in the net current in selector device 202(a) being the sum of currents from the supply $V_s$ and coupling capacitor 204 element. This results in the total current through selector device 202(a) to be greater than the holding current $V_h$ and thus selector device 202(a) ON-state 506 is stabilized.

Figure 6C:
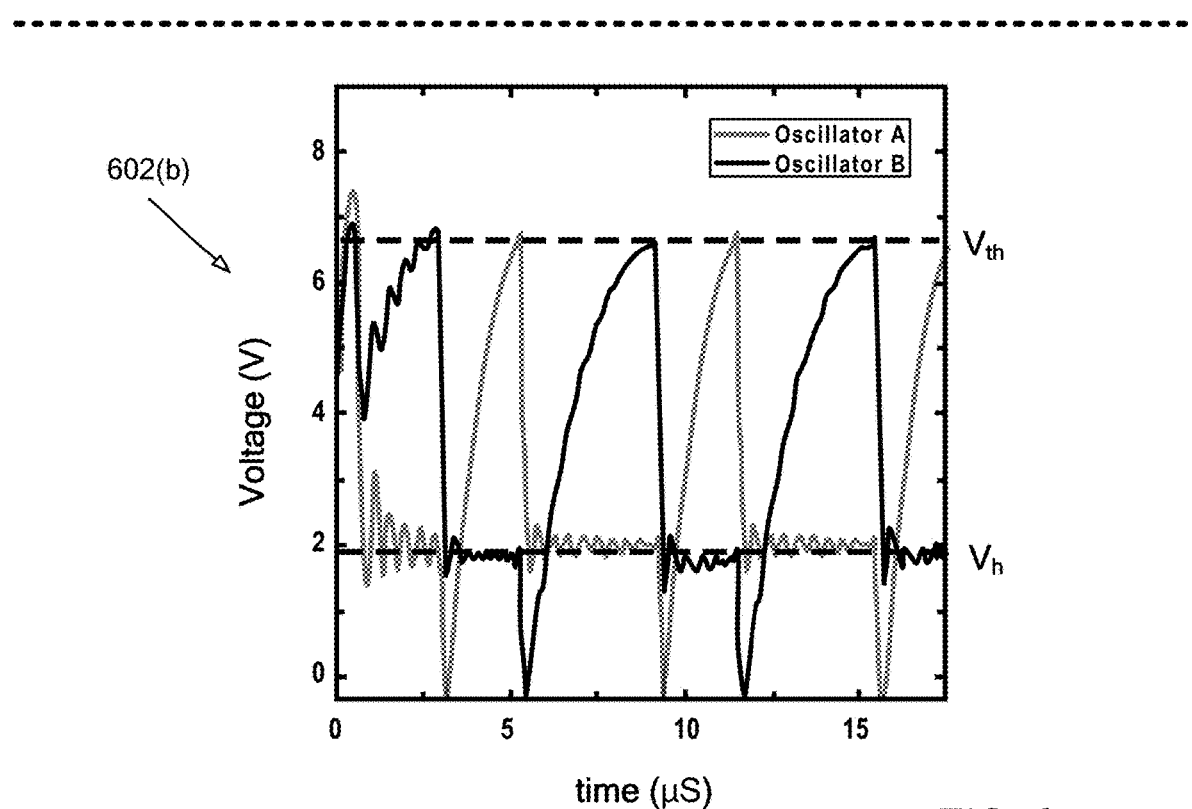
FIG. 6c shows example voltage waveforms of two coupled selector devices in a stabilized state, according to one embodiment of the present disclosure.
Figure 6D:
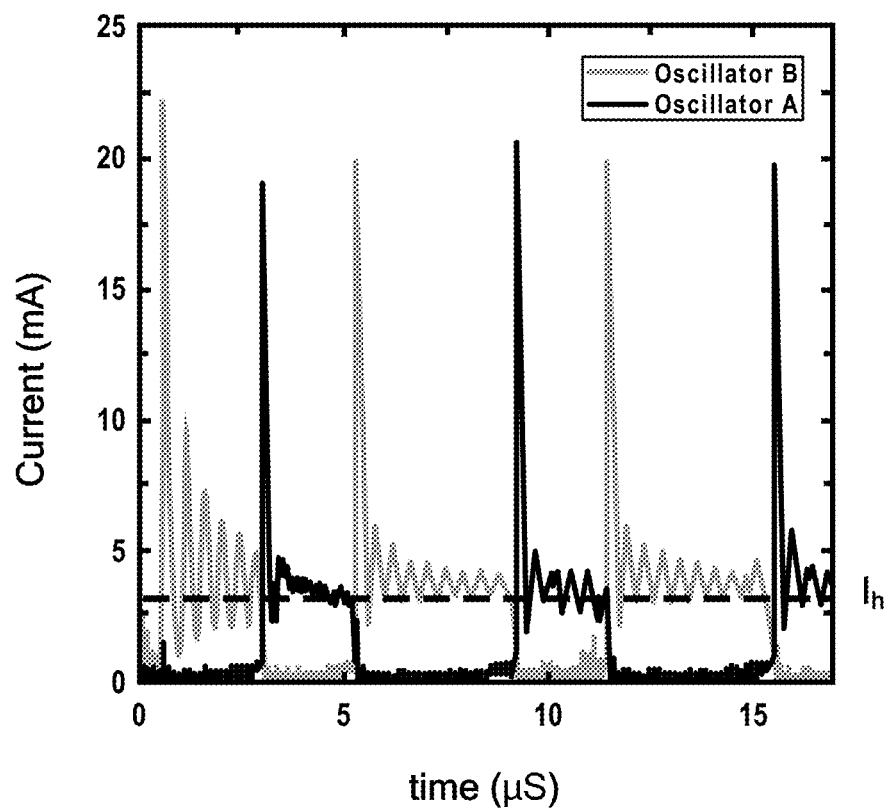
FIG. 6d shows an example of current waveforms of two coupled selector devices in a stabilized state, according to one embodiment of the present disclosure.

FIG. 6c shows example voltage waveforms of two coupled selector devices in a stabilized state according to one embodiment of the present disclosure. FIG. 6d shows an example of current waveforms of two coupled selector devices in a stabilized state according to one embodiment of the present disclosure. As shown in FIG. 6c, the voltage and current waveforms of the coupled selector device pair (202(a)-202(b)) with dissimilar voltages indicate the stabilization of one of the selector devices in ON-state 506 at $V_h, I_h$ while the other selector device charges.

At $t=t_1$, selector device 202(b) switches to the ON-state 506 (as the node voltage exceeds the threshold voltage $V_t$), the displacement current through the capacitive branch (i.e., capacitor 204) reverses direction and reduces the current through selector device 202(a). This causes the stabilized ON-state of selector device 202(a) to become unstable, and the selector device 202 resistance reverts back to OFF-state 508. As this process is occurring, the displacement current from the coupling stabilizes ON-state 506 of selector device of 202(b) until selector device 202(a) reaches its threshold voltage $V_t$. This process keeps repeating itself, resulting in a full 180 out of phase coupling.

Comparing FIGS. 6c-6d, note that each selector device 202(a)-202(b) must be able to exist in both a low voltage state and high voltage state. Note, as shown in FIG. 6d, that the currents are not very different. A NDR region 504 is used to maintain two states. In particular, the current flowing through each selector device 202(a)-202(b) depends on the voltage divider between the PMOS transistor and corresponding selector device. During the transition the current does not change significantly but the voltage does.

While oscillatory behavior for two coupled selector devices 202(a)-202(b) has been described, $V_s > V_{osc-thresh}$, no sustained oscillations will occur and device 200 may be utilized as an SRAM cell in which selector devices 202(a)-202(b) may be caused to transition between ON-state 506 and OFF-state 508 in a controlled fashion. This controlled behavior may be leveraged to write or read binary data to 2T-2S SRAM cell 200.

Figure 7:
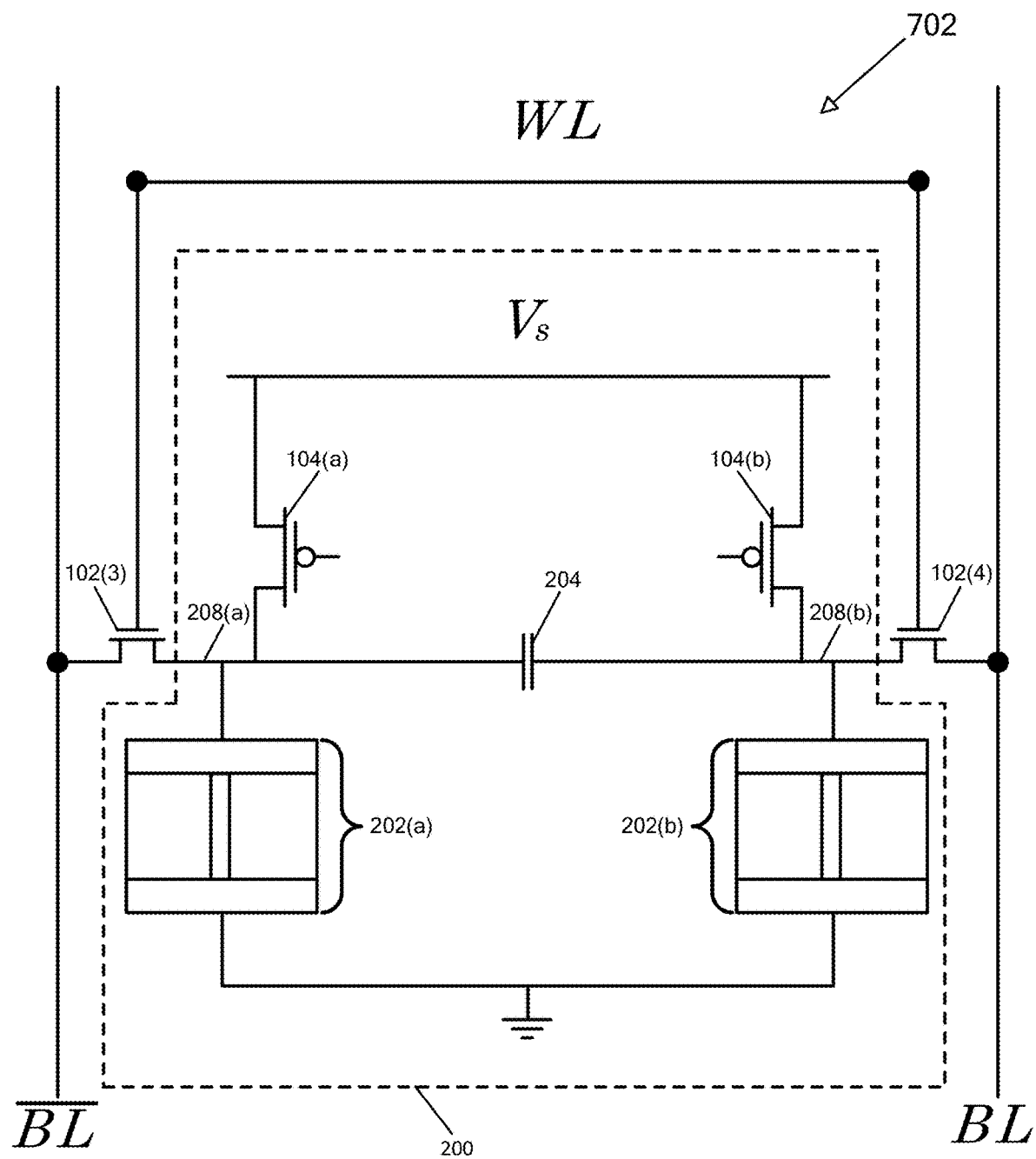
FIG. 7 is a schematic of a 2T-2S SRAM cell coupled via access transistors to bitlines and controlled by a wordline, according to one embodiment of the present disclosure.

FIG. 7 is a schematic of a 2T-2S SRAM cell coupled via access transistors to bitlines and controlled by a wordline according to one embodiment of the present disclosure. Bitline coupled 2T-2S SRAM cell 702 may be incorporated to function as a memory cell in a larger context of a multitude of cells according to one embodiment of the present disclosure. As shown in FIG. 7, 2T-2S SRAM cell 200 is coupled to bitlines BL and $\overline{BL}$ via respective access transistors 102(3) and 102(4). Although access transistors 102(3)-102(4) are shown as NMOS transistors in FIG. 7, it will be understood that access transistors 102(3)-102(4) may be PMOS transistors in alternative embodiments. Furthermore, as shown in FIG. 7, respective gates of access transistors 102(3)-102(4) may be coupled to WL, which controls the on and off state of access transistors 102(3)-102(4) for reading and writing to 2T-2S SRAM cell 200.

As with a traditional SRAM cell, according to one embodiment, bitline coupled SRAM cell 702 may operate in three different states: standby (the circuit is idle), reading (the data has been requested) or writing (updating the contents). These states are described below.

Standby State

If word line ("WL") is not asserted, access transistors 102(3) and 102(4) disconnect SRAM cell 200 from bit lines (BL and $\overline{BL}$). Selector devices 202(a)-202(b) will maintain their respective states (e.g., ON-state 506 and OFF-state 508 or vice versa).

Reading State

Reading 2T-2S SRAM cell 200 may be achieved by asserting WL and reading SRAM cell 200 state by a single access transistor and bit line, (e.g. 102(4), BL). Nevertheless, bit lines are relatively long and have large parasitic capacitance. To speed up reading, a more complex process is used in practice. A read cycle may be started by precharging both bit lines BL and $\overline{BL}$, i.e., driving the bit lines to a threshold voltage (midrange voltage between logical 1 and 0) by an external module (not shown in FIG. 7). Then asserting word line WL enables both access transistors 102(3) and 102(4), which causes the bit line BL voltage to either slightly drop or rise. It should be noted that if BL voltage rises, $\overline{BL}$ voltage drops, and vice versa. Then BL and $\overline{BL}$ lines will have a small voltage difference between them. A sense amplifier may sense which line has the higher voltage and thus determine whether there was 1 or 0 stored. The higher the sensitivity of the sense amplifier, the faster the read operation.

Writing State

As an example, assume that a digital '0' is to be written to selector device 202(a) and a digital '1' is to be written to selector device 202(b) (i.e., node 208(a) is low and node 208(b) is high). In order to accomplish this, selector device 202(a) must enter a conductive state. This may be achieved by turning on access transistors 102(3) using WL and applying a high voltage on $\overline{BL}$. This will switch selector device 202(a) to ON-state 506 forcing node 208(a) to a low voltage. Via the displacement current across capacitor 204, if node 208(a) is at a low voltage, node 208(b) will be at a high voltage. In this instance, selector device 202(b) will be in OFF-state 508 as the voltage at node 208(b) will be just below voltage $V_t$ sufficient to cause selector device 202(b) to be in ON-state 506 (i.e., node 208(b) will be in OFF-state 508).

In order to write a digital '1' to selector device 202(a) and a digital '0' to selector device 202(b), selector device 202(a) must enter a resistive state. This may be achieved by turning on access transistors 102(3) using WL and applying a low voltage on $\overline{BL}$. In this instance node 208(a) will be at a high voltage and node 208(b) will be a low voltage causing selector device 202(a) to enter OFF-state 508. This will cause selector device 202(b) to enter ON-state 506.

Figure 8:
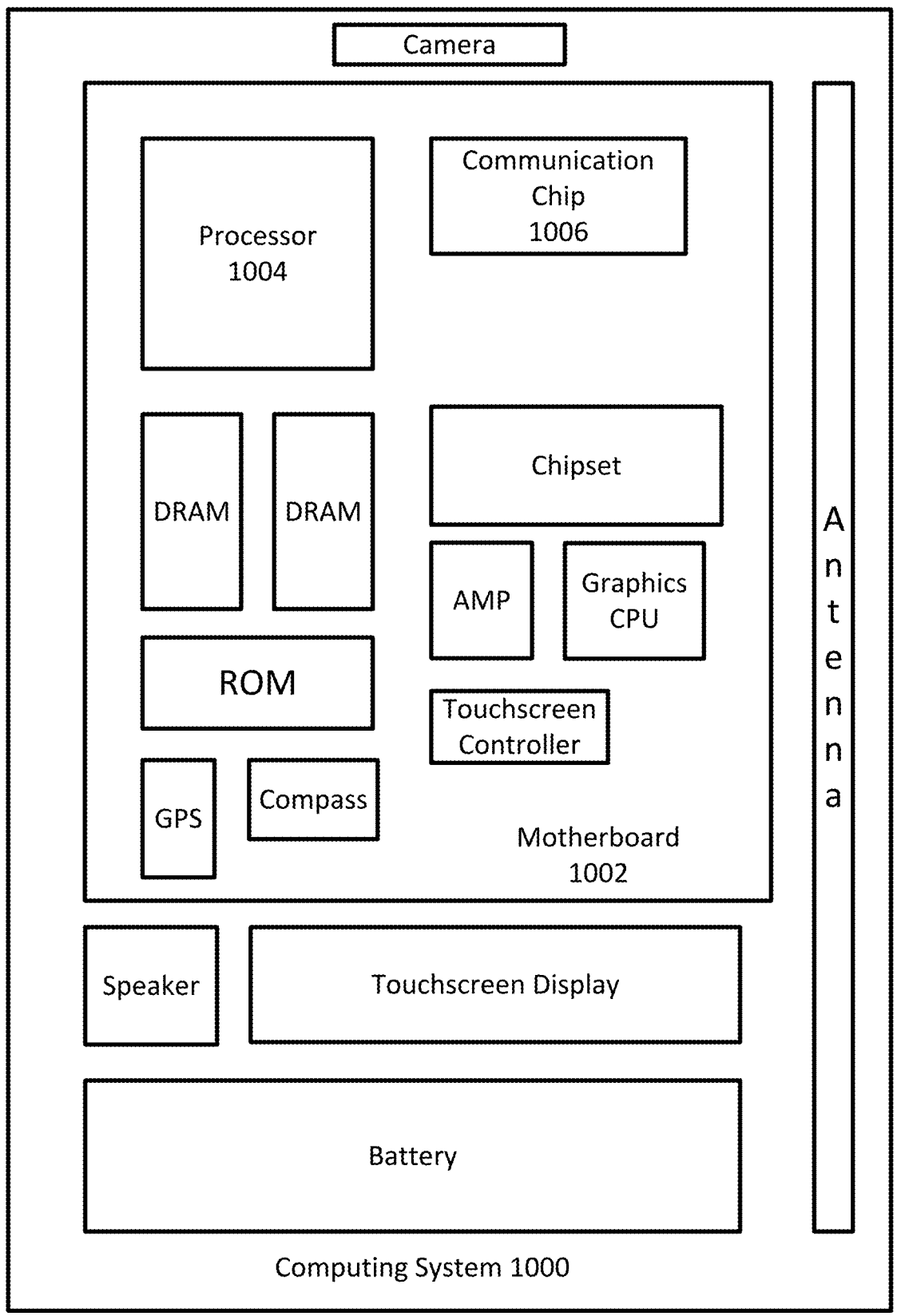
FIG. 8 illustrates a computing system implemented with integrated circuit structures and/or transistor devices formed using the techniques disclosed herein, in accordance with some embodiments of the present disclosure.

FIG. 8 illustrates a computing system 1000 implemented with integrated circuit structures and/or transistor devices formed using the techniques disclosed herein, in accordance with some embodiments of the present disclosure. Computing system 1000 may employ a number of bitline coupled 2T-SRAM cells 702, or other back-end memory cells as provided herein. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices configured in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices configured as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices configured as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1 is a static random-access memory ("SRAM") cell comprising: a first transistor including a first source node and a first drain node; a second transistor including a second source node and a second drain node; a capacitor including a first terminal and a second terminal, wherein said first terminal is electrically coupled to said first drain node and said second terminal is electrically coupled to said second drain node; a first 2-terminal device, wherein a first terminal of said first 2-terminal device is electrically coupled to said first terminal of said capacitor and a second terminal of said first 2-terminal device is electrically coupled to a ground node; and a second 2-terminal device, wherein a first terminal of said second 2-terminal device is electrically coupled to said second terminal of said capacitor and a second terminal of said second 2-terminal device is electrically coupled to said ground node; wherein the first and second 2-terminal devices exhibit a voltage-dependent volatile resistance state change, such that a state of said SRAM cell is achieved by causing said first 2-terminal device to be in a first resistance state and said second 2-terminal device to be in a second resistance state.

Example 2 includes the subject matter of Example 1, wherein said first 2-terminal device and said second 2-terminal device are located in a back-end interconnect structure above a device layer.

Example 3 includes the subject matter of Example 1 or 2, wherein a first resistance state of said SRAM device is achieved by placing said first 2-terminal device in a low voltage state and said second 2-terminal device in a high voltage state.

Example 4 includes the subject matter of any of the previous Examples, wherein a second resistance state of said SRAM cell is achieved by placing said first 2-terminal device in a high voltage state and said second 2-terminal device in a low voltage state.

Example 5 includes the subject matter of any of the previous Examples, wherein an I-V characteristic of said first 2-terminal device and said second 2-terminal exhibits a first region of low voltage and high current, a second region of high voltage and low current, and a third region of negative differential resistance.

Example 6 includes the subject matter of any of the previous Examples, wherein at least one of said first and second 2-terminal devices further comprises a first metal layer, a second metal layer, and an oxide and semiconductor layer between said first metal layer and said second metal layer.

Example 7 includes the subject matter of any of the previous Examples, wherein at least one of said first and second 2-terminal devices further comprises a first metal layer, a second metal layer, and an inner layer, said inner layer comprising one of niobium dioxide (NbO2), tantalum oxide (TaOx), vanadium dioxide (VO2), nickel oxide (NiO), titanium, tellurium, arsenic, and germanium.

Example 8 is a static random-access memory ("SRAM") cell comprising: a first transistor including a first source node and a first drain node; a second transistor including a second source node and a second drain node; a capacitor including a first terminal and a second terminal, wherein said first terminal is electrically coupled to said first drain node and said second terminal is electrically coupled to said second drain node; a first 2-terminal device, wherein a first terminal of said first 2-terminal device is electrically coupled to said first terminal of said capacitor and a second terminal of said first 2-terminal device is electrically coupled to a ground node; a second 2-terminal device, wherein a first terminal of said second 2-terminal device is electrically coupled to said second terminal of said capacitor and a second terminal of said second 2-terminal device is electrically coupled to said ground node; and a first access transistor and a second access transistor, wherein a drain node of said first access transistor is electrically coupled to said first terminal of said capacitor, and a drain node of said second access transistor is electrically coupled to said second terminal of said capacitor; wherein the first and second 2-terminal devices exhibit a voltage-dependent volatile resistance state change, such that a state of said SRAM cell is achieved by causing said first 2-terminal device to be in a first resistance state and said second 2-terminal device to be in a second resistance state.

Example 9 includes the subject matter of Example 8, wherein a source node of said first access transistor is electrically coupled to a first bitline and a source node of said second access transistor is electrically coupled to a second bitline.

Example 10 includes the subject matter of Example 8 or 9, wherein each of the first and second access transistors further comprises a respective gate node, and a wordline is coupled to each of said gate nodes.

Example 11 includes the subject matter of any of Examples 8 through 10, wherein said first 2-terminal device and said second 2-terminal device are located in a back-end interconnect structure above a device layer.

Example 12 includes the subject matter of any of Examples 8 through 11, wherein a first resistance state of said SRAM cell is achieved by placing said first 2-terminal device in a low voltage state and said second 2-terminal device in a high voltage state.

Example 13 includes the subject matter of any of Examples 8 through 12, wherein a second resistance state of said SRAM cell is achieved by placing said first 2-terminal device in a high voltage state and said second 2-terminal device in a low voltage state.

Example 14 includes the subject matter of any of Examples 8 through 13, wherein an I-V characteristic of said first 2-terminal device and said second 2-terminal device exhibits a first region of low voltage and high current, a second region of high voltage and low current, and a third region of negative differential resistance.

Example 15 includes the subject matter of any of Examples 8 through 14, wherein at least one of said first and second 2-terminal devices further comprises a first metal layer, a second metal layer, and an oxide and semiconductor layer between said first metal layer and said second metal layer.

Example 16 includes the subject matter of any of Examples 8 through 15, wherein at least one of said first and second 2-terminal devices further comprises a first metal layer, a second metal layer, and an inner layer, said inner layer comprised of one of niobium dioxide (NbO2), tantalum oxide (TaOx), vanadium dioxide (VO2), nickel oxide (NiO), titanium, tellurium, arsenic, and germanium.

Example 17 is a computing system comprising: a motherboard, wherein said motherboard further includes a processor, a communication chip, and a static random access memory ("SRAM") bank. The SRAM bank includes a plurality of SRAM cells, wherein an SRAM cell of the plurality includes: a first transistor including a first source node and a first drain node; a second transistor including a second source node and a second drain node; a capacitor including a first terminal and a second terminal, wherein said first terminal is electrically coupled to said first drain node and said second terminal is electrically coupled to said second drain node; a first 2-terminal device, wherein a first terminal of said first 2-terminal device is electrically coupled to said first terminal of said capacitor and a second terminal of said first 2-terminal device is electrically coupled to a ground node; and a second 2-terminal device, wherein a first terminal of said second 2-terminal device is electrically coupled to said second terminal of said capacitor and a second terminal of said second 2-terminal device is electrically coupled to said ground node; wherein the first and second 2-terminal devices exhibit a voltage-dependent volatile resistance state change, such that a state of said SRAM cell is achieved by causing said first 2-terminal device to be in a first resistance state and said second 2-terminal device to be in a second resistance state.

Example 18 includes the subject matter of Example 17, wherein said first 2-terminal device and said second 2-terminal device are located in a back-end interconnect structure above a device layer.

Example 19 includes the subject matter of Example 17 or 18, wherein a first resistance state of said SRAM cell is achieved by placing said first 2-terminal device in a low voltage state and said second 2-terminal device in a high voltage state.

Example 20 includes the subject matter of any of Examples 17 through 19, wherein a second resistance state of said SRAM cell is achieved by placing said first 2-terminal device in a high voltage state and said second 2-terminal device in a low voltage state.

Example 21 is an integrated circuit comprising: a device layer including one or more transistors; and an interconnect structure over the device layer. The interconnect structure includes a capacitor, a first 2-terminal selector device, and a second 2-terminal selector device. The capacitor includes a first electrode, a second electrode, and a dielectric between the first and second electrode. A first terminal of the first selector device is electrically coupled to the first terminal of the capacitor, and a second terminal of the first selector device is electrically coupled to a conductive node (such as a ground node, or some other node). A first terminal of the second selector device is electrically coupled to the second terminal of the capacitor and a second terminal of the second selector device is electrically coupled to the conductive node.

Example 22 includes the subject matter of Example 21, wherein the first and second 2-terminal selector devices exhibit a voltage-dependent volatile resistance state change, such that a memory cell state is achieved by causing the first 2-terminal device to be in a first resistance state and the second 2-terminal device to be in a second resistance state.

Example 23 includes the subject matter of Example 21 or 22, wherein a first memory cell state is achieved by placing the first 2-terminal selector device in a low voltage state and the second 2-terminal selector device in a high voltage state.

Example 24 includes the subject matter of any of Examples 21 through 23, wherein a second memory cell state is achieved by placing the first 2-terminal selector device in a high voltage state and the second 2-terminal selector device in a low voltage state.

Example 25 includes the subject matter of any of Examples 21 through 23, wherein at least one of the first and second 2-terminal selector devices comprises a first metal layer, a second metal layer, and an oxide and semiconductor layer between the first metal layer and the second metal layer.

Example 26 includes the subject matter of any of Examples 21 through 25, wherein at least one of the first and second 2-terminal selector devices comprises a first metal layer, a second metal layer, and an inner layer, said inner layer comprised of one or more of niobium dioxide (NbO2), tantalum oxide (TaOx), vanadium dioxide (VO2), nickel oxide (NiO), titanium, tellurium, arsenic, and germanium.

The foregoing description of example embodiments of the disclosure has been presented for the purposes of illustration and description. It is not intended to be exhaustive or to limit the disclosure to the precise forms disclosed. Many modifications and variations are possible in light of this disclo-

What is claimed is:

1. A static random-access memory ("SRAM") cell comprising:
a first transistor including a first source node and a first drain node;
a second transistor including a second source node and a second drain node;
a capacitor including a first terminal and a second terminal, wherein said first terminal is electrically coupled to said first drain node and said second terminal is electrically coupled to said second drain node; a first 2-terminal device, wherein a first terminal of said first 2-terminal device is electrically coupled to said first terminal of said capacitor and a second terminal of said first 2-terminal device is electrically coupled to a ground node; and
a second 2-terminal device, wherein a first terminal of said second 2-terminal device is electrically coupled to said second terminal of said capacitor and a second terminal of said second 2-terminal device is electrically coupled to said ground node;
wherein the first and second 2-terminal devices exhibit a voltage-dependent volatile resistance state change, such that a state of said SRAM cell is achieved by causing said first 2-terminal device to be in a first resistance state and said second 2-terminal device to be in a second resistance state.

2. The SRAM cell according to claim 1, wherein said first 2-terminal device and said second 2-terminal device are located in a back-end interconnect structure above a device layer.

3. The SRAM cell according to claim 1, wherein a first resistance state of said SRAM cell is achieved by placing said first 2-terminal device in a low voltage state and said second 2-terminal device in a high voltage state.

4. The SRAM cell according to claim 1, wherein a second resistance state of said SRAM cell is achieved by placing said first 2-terminal device in a high voltage state and said second 2-terminal device in a low voltage state.

5. The SRAM cell according to claim 1, wherein an I-V characteristic of said first 2-terminal device and said second 2-terminal exhibits a first region of low voltage and high current, a second region of high voltage and low current, and a third region of negative differential resistance.

6. The SRAM cell according claim 1, wherein at least one of said first and second 2-terminal devices further comprises a first metal layer, a second metal layer, and an oxide and semiconductor layer between said first metal layer and said second metal layer.

7. The SRAM cell according to claim 1, wherein at least one of said first and second 2-terminal devices further comprises a first metal layer, a second metal layer, and an inner layer, said inner layer comprising one of niobium dioxide (NbO2), tantalum oxide (TaOx), vanadium dioxide (VO2), nickel oxide (NiO), titanium, tellurium, arsenic, and germanium.

8. A static random-access memory ("SRAM") cell comprising:
a first transistor including a first source node and a first drain node;
a second transistor including a second source node and a second drain node;
a capacitor including a first terminal and a second terminal, wherein said first terminal is electrically coupled to said first drain node and said second terminal is electrically coupled to said second drain node;
a first 2-terminal device, wherein a first terminal of said first 2-terminal device is electrically coupled to said first terminal of said capacitor and a second terminal of said first 2-terminal device is electrically coupled to a ground node;
a second 2-terminal device, wherein a first terminal of said second 2-terminal device is electrically coupled to said second terminal of said capacitor and a second terminal of said second 2-terminal device is electrically coupled to said ground node; and
a first access transistor and a second access transistor, wherein a drain node of said first access transistor is electrically coupled to said first terminal of said capacitor, and a drain node of said second access transistor is electrically coupled to said second terminal of said capacitor;
wherein the first and second 2-terminal devices exhibit a voltage-dependent volatile resistance state change, such that a state of said SRAM cell is achieved by causing said first 2-terminal device to be in a first resistance state and said second 2-terminal device to be in a second resistance state.

9. The SRAM cell according to claim 8, wherein a source node of said first access transistor is electrically coupled to a first bitline and a source node of said second access transistor is electrically coupled to a second bitline.

10. The SRAM cell according to claim 8, wherein each of the first and second access transistors further comprises a respective gate node, and a wordline is coupled to each of said gate nodes.

11. The SRAM cell according to claim 8, wherein said first 2-terminal device and said second 2-terminal device are located in a back-end interconnect structure above a device layer.

12. The SRAM cell according to claim 8, wherein a first resistance state of said SRAM cell is achieved by placing said first 2-terminal device in a low voltage state and said second 2-terminal device in a high voltage state.

13. The SRAM cell according to claim 8, wherein a second resistance state of said SRAM cell is achieved by placing said first 2-terminal device in a high voltage state and said second 2-terminal device in a low voltage state.

14. The SRAM cell according to claim 8, wherein an I-V characteristic of said first 2-terminal device and said second 2-terminal device exhibits a first region of low voltage and high current, a second region of high voltage and low current, and a third region of negative differential resistance.

15. The SRAM cell according to claim 8, wherein at least one of said first and second 2-terminal devices further comprises a first metal layer, a second metal layer, and an oxide and semiconductor layer between said first metal layer and said second metal layer.

16. The SRAM cell according to claim 8, wherein at least one of said first and second 2-terminal devices further comprises a first metal layer, a second metal layer, and an inner layer, said inner layer comprised of one of niobium dioxide (NbO2), tantalum oxide (TaOx), vanadium dioxide (V02), nickel oxide (NiO), titanium, tellurium, arsenic, and germanium.

17. A computing system comprising:
a motherboard, wherein said motherboard includes a processor, a communication chip, and a static random access memory ("SRAM") bank, further comprising a plurality of SRAM cells, wherein an SRAM cell of the plurality includes a first transistor including a first source node and a first drain node, a second transistor including a second source node and a second drain node, a capacitor including a first terminal and a second terminal, wherein said first terminal is electrically coupled to said first drain node and said second terminal is electrically coupled to said second drain node, a first 2-terminal device, wherein a first terminal of said first 2-terminal device is electrically coupled to said first terminal of said capacitor and a second terminal of said first 2-terminal device is electrically coupled to a ground node, and a second 2-terminal device, wherein a first terminal of said second 2-terminal device is electrically coupled to said second terminal of said capacitor and a second terminal of said second 2-terminal device is electrically coupled to said ground node, wherein the first and second 2-terminal devices exhibit a voltage-dependent volatile resistance state change, such that a state of said SRAM cell is achieved by causing said first 2-terminal device to be in a first resistance state and said second 2-terminal device to be in a second resistance state.

18. The computing system according to claim 17, wherein said first 2-terminal device and said second 2-terminal device are located in a back-end interconnect structure above a device layer.

19. The computing system according to claim 17, wherein a first resistance state of said SRAM cell is achieved by placing said first 2-terminal device in a low voltage state and said second 2-terminal device in a high voltage state.

20. The computing system according to claim 17, wherein a second resistance state of said SRAM cell is achieved by placing said first 2-terminal device in a high voltage state and said second 2-terminal device in a low voltage state.

* * * * *